(12) United States Patent
Rubin et al.

(10) Patent No.: US 10,386,410 B2
(45) Date of Patent: Aug. 20, 2019

(54) HIGHLY FLEXIBLE PERFORMANCE COUNTER AND SYSTEM DEBUG MODULE

(71) Applicant: Samsung Electronics Co., Ltd., Suwon-si, Gyeonggi-do (KR)

(72) Inventors: Lawrence H. Rubin, Austin, TX (US); David C. Tannenbaum, Austin, TX (US)

(73) Assignee: SAMSUNG ELECTRONICS CO., LTD. (KR)

( * ) Notice: Subject to any disclaimer, the term of this patent is extended or adjusted under 35 U.S.C. 154(b) by 190 days.

(21) Appl. No.: 15/464,334

(22) Filed: Mar. 20, 2017

(65) Prior Publication Data

US 2018/0164372 A1  Jun. 14, 2018

Related U.S. Application Data

(60) Provisional application No. 62/433,027, filed on Dec. 12, 2016.

(51) Int. Cl.
*G01R 31/28* (2006.01)
*G01R 31/317* (2006.01)
*G06F 11/00* (2006.01)

(52) U.S. Cl.
CPC ........ *G01R 31/31705* (2013.01); *G06F 11/00* (2013.01)

(58) Field of Classification Search
CPC .......... G01R 31/31705; G01R 31/2874; G01R 31/2884; G01R 35/005; G01R 31/31721; G01R 31/30; G06F 11/00; G06F 1/3203; G06F 1/206; G06F 1/26; G06F 11/27; G06T 1/20; H03K 19/003; H03K 31/30
See application file for complete search history.

(56) References Cited

U.S. PATENT DOCUMENTS

| | | | |
|---|---|---|---|
| 8,089,485 B2 | 1/2012 | Harada | |
| 2007/0139421 A1* | 6/2007 | Chen | G06T 1/20 345/501 |
| 2015/0070367 A1 | 3/2015 | Fam et al. | |
| 2015/0082092 A1* | 3/2015 | Sarangi | G06F 11/27 714/30 |
| 2017/0089975 A1* | 3/2017 | Savoj | G01R 31/2874 |

* cited by examiner

*Primary Examiner* — Guerrier Merant
(74) *Attorney, Agent, or Firm* — Renaissance IP Law Group LLP

(57) ABSTRACT

According to one general aspect, an apparatus may include a plurality of performance and debug monitoring circuits (PDMCs). Each performance and debug monitoring circuit (PDMC) may include an input stage, a combinatorial stage, and a counter. The input stage may be configured to receive a plurality of input signals, wherein the input signals include: signals from other performance and debug monitoring circuits, signals from combinatorial logic circuits, and configuration values. The combinatorial stage may be configured to perform one or more logical operations on a selected sub-set of the input signals. The counter may be configured to increment based, at least in part, upon a result of the combinatorial stage.

20 Claims, 4 Drawing Sheets

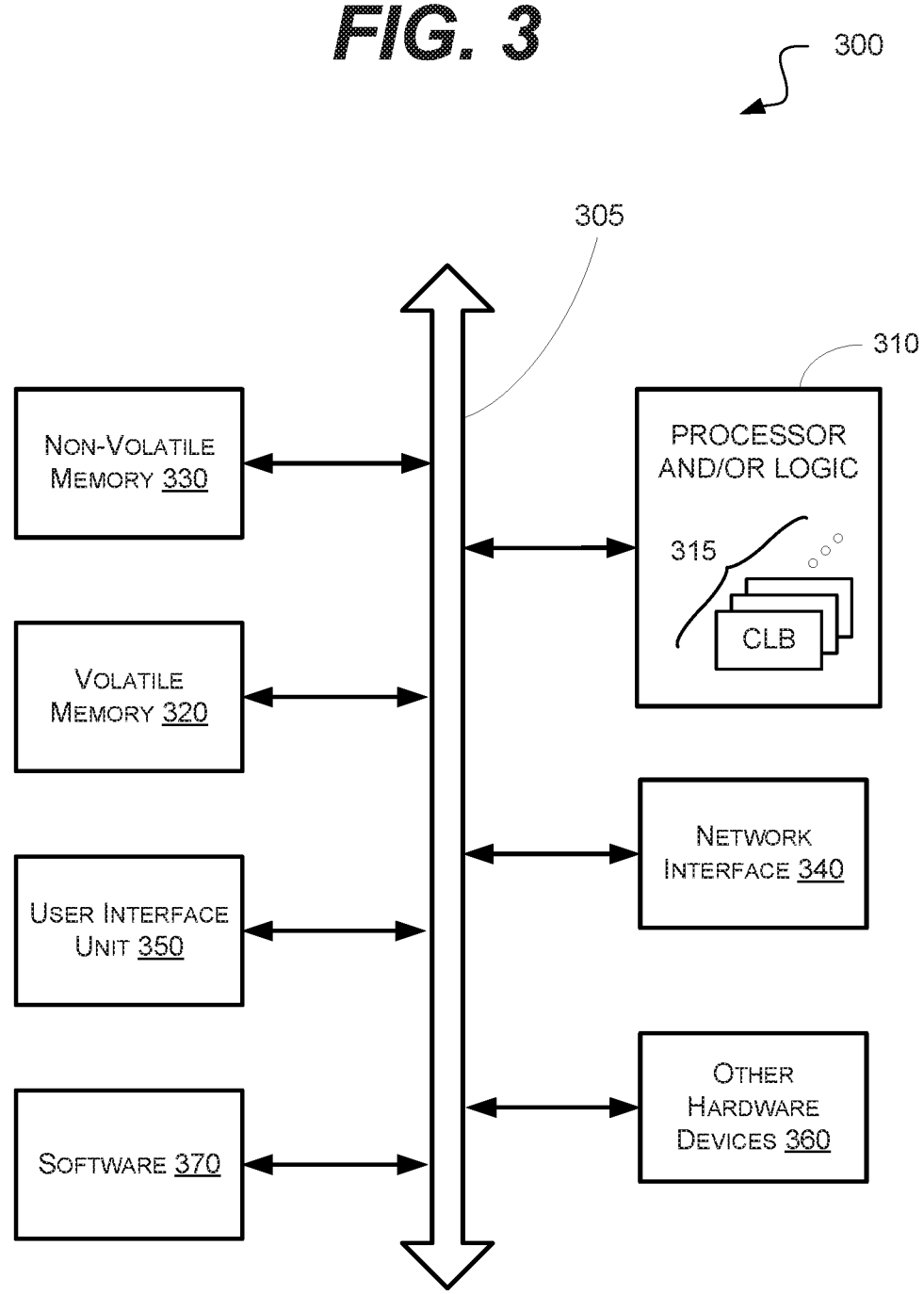

HIGHLY FLEXIBLE PERFORMANCE COUNTER AND SYSTEM DEBUG MODULE

CROSS-REFERENCE TO RELATED APPLICATION

This application claims priority under 35 U.S.C. § 119 to Provisional Patent Application Ser. No. 62/433,027, entitled "HIGHLY FLEXIBLE PERFORMANCE COUNTER AND SYSTEM DEBUG MODULE" filed on Dec. 12, 2016. The subject matter of this earlier filed application is hereby incorporated by reference.

TECHNICAL FIELD

This description relates to performance monitoring and design for debug (DFD), and more specifically to a highly flexible performance counter and system debug module.

BACKGROUND

A graphics processing unit (GPU), occasionally called a visual processing unit (VPU), is a specialized electronic circuit designed to rapidly manipulate and alter memory to accelerate the creation of images in a frame buffer intended for output to a display device. GPUs are occasionally used in embedded systems, mobile phones, personal computers, workstations, and game consoles. Sometimes they are stand-alone integrated circuits, other time they are incorporated into larger devices, such as systems-on-a-chip (SoC). Modern GPUs are very efficient at manipulating computer graphics and image processing, and their highly parallel structure makes them more efficient than general-purpose CPUs for programs where the processing of large blocks of data is done in parallel.

In computers, hardware performance counters, or performance monitoring unit (PMUs) are generally a set of special-purpose registers built into modern microprocessors to store the counts of hardware-related activities within computer systems. Compared to software profilers, hardware counters provide low-overhead access to a wealth of detailed performance information related to CPU's functional units, caches, and main memory.

Design for testing or design for testability (DFT) consists of integrated circuit (IC) design techniques that add testability features to a hardware product design. The added features make it easier to develop and apply manufacturing tests to the designed hardware. Often the purpose of manufacturing tests is to validate that the product hardware contains no manufacturing defects that could adversely affect the product's correct functioning.

In addition to being useful for manufacturing "go/no go" testing, the feature can also be used to "debug" chip designs. In this context, the chip is exercised in normal or functional mode (for example, a computer or mobile-phone chip might execute assembly language instructions). At any time, the chip may be re-configured into "test mode". At this point the full or partial internal state can be dumped out, or set to any desired values, by use of the DFT features. Another use of DFT to aid debug consists of scanning in an initial state to all memory elements and then go back to functional mode to perform system debug. The advantage is to bring the system to a known state without going through many clock cycles. This use of DFT features, along with the clock control circuits are a related sub-discipline of logic design called "Design for Debug" or "Design for Debuggability" (DFD).

SUMMARY

According to one general aspect, an apparatus may include a plurality of performance and debug monitoring circuits (PDMCs). Each performance and debug monitoring circuit (PDMC) may include an input stage, a combinatorial stage, and a counter. The input stage may be configured to receive a plurality of input signals, wherein the input signals include: signals from other performance and debug monitoring circuits, signals from combinatorial logic circuits, and configuration values. The combinatorial stage may be configured to perform one or more logical operations on a selected sub-set of the input signals. The counter may be configured to increment based, at least in part, upon a result of the combinatorial stage.

According to another general aspect, a system may include a graphic processing circuit and a plurality of performance and debug monitoring circuits (PDMCs). The graphic processing circuit may be configured to manipulate and alter data in a memory to create images for output to a display device, comprising a plurality of combinatorial logic circuits. Each of the performance and debug monitoring circuits (PDMCs) may include an input stage, a combinatorial stage, and a counter. The input stage may be configured to receive a plurality of input signals, wherein the input signals include: signals from other performance and debug monitoring circuits, signals from combinatorial logic circuits, and configuration values. The combinatorial stage may be configured to perform one or more logical operations on a selected sub-set of the input signals. The counter may be configured to increment based, at least in part, upon a result of the combinatorial stage.

According to another general aspect, a method may include receiving, by a performance and debug monitoring circuit (PDMC), a plurality of input signals. The input signals may include: signals from other PDMCs, signals from combinatorial logic circuits, and configuration values. The method may include performing one or more logical operations on a selected sub-set of the input signals. The method may include incrementing a counter based, at least in part, upon a result of the one or more logical operations.

The details of one or more implementations are set forth in the accompanying drawings and the description below. Other features will be apparent from the description and drawings, and from the claims.

A system and/or method for performance monitoring and design for debug (DFD), and more specifically to a highly flexible performance counter and system debug module, substantially as shown in and/or described in connection with at least one of the figures, as set forth more completely in the claims.

BRIEF DESCRIPTION OF THE DRAWINGS

FIG. 3 is a schematic block diagram of an information processing system that may include devices formed according to principles of the disclosed subject matter.

Like reference symbols in the various drawings indicate like elements.

DETAILED DESCRIPTION

Figure 1:
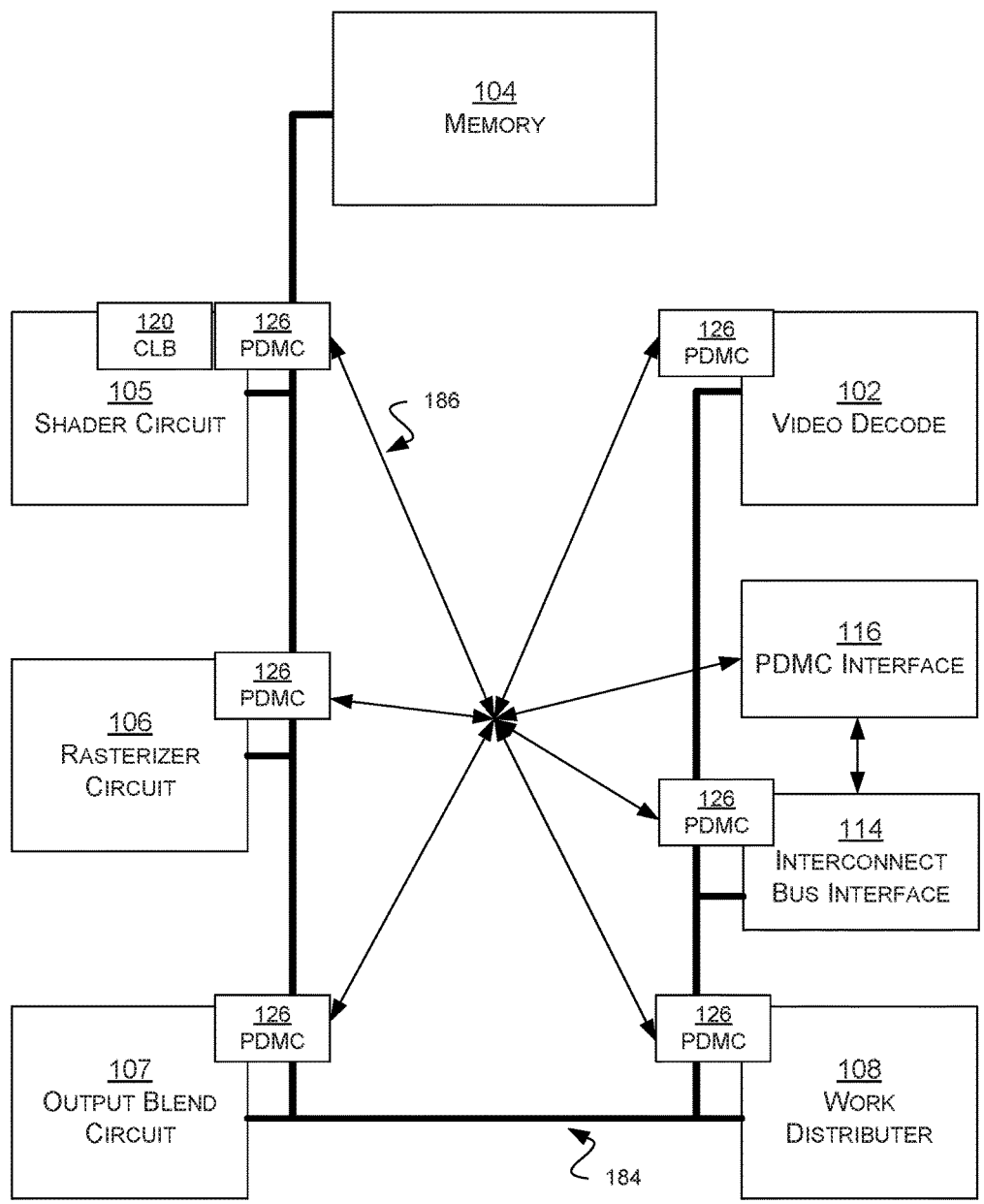
FIG. 1 is a block diagram of an example embodiment of a system in accordance with the disclosed subject matter.

Various example embodiments will be described more fully hereinafter with reference to the accompanying drawings, in which some example embodiments are shown. The present disclosed subject matter may, however, be embodied in many different forms and should not be construed as limited to the example embodiments set forth herein. Rather, these example embodiments are provided so that this disclosure will be thorough and complete, and will fully convey the scope of the present disclosed subject matter to those skilled in the art. In the drawings, the sizes and relative sizes of layers and regions may be exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on", "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, and so on may be used herein to describe various elements, components, regions, layers and/or sections, these elements, components, regions, layers and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present disclosed subject matter.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present disclosed subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosed subject matter.

Unless otherwise defined, all terms (including technical and scientific terms) used herein have the same meaning as commonly understood by one of ordinary skill in the art to which this disclosed subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIG. 1 is a block diagram of an example embodiment of a system in accordance with the disclosed subject matter. In various embodiments, the system 100 may include a processor, such as a central processor or graphics processor, or more generally a system-on-a-chip (SoC). In the illustrated embodiment, the system 100 is shown as a graphics processor unit (GPU). It is understood that the above is merely one illustrative example to which the disclosed subject matter is not limited.

In various embodiments, the system 100 may include a memory 104, a video decode 102, and a number of other functional unit blocs (FUBs). In the illustrated embodiment, the FUBs may include a video decode 102, shader circuit 105, a rasterizer circuit 106, an output blend circuit 107, and a work distributer 108. Each of these FUBs may themselves be or may include a number of combinatorial logic blocks (CLBs) 120. Each CBL 120 may include a combination of various pieces of Boolean logic and memory registers (e.g., latches, flip-flops) configured to perform a certain task or part of a larger task. It is understood that the above are merely a few illustrative examples to which the disclosed subject matter is not limited.

In the illustrated embodiment, the system 100 may include an interconnect bus 184 configured to connect and manage combinatorial logical blocks 120 or FUBs during normal operation of the system 100. In the illustrated embodiment, the interconnect bus 184 may be synchronized or controlled by a clock signal. Since this clock signal generally controls the core FUBs of the system 100 it may be referred to as the core clock. In some embodiments, the interconnect bus 184 may be accessed (read from, written to) via an interconnect bus interface 114. In one specific embodiment, the interconnect bus 184 may communicate (via interconnect bus interface 114) with an Advance High-Performance Bus (AHB) often employed in Advance RISC Machines (ARM) processor. It is understood that the above is merely one illustrative example to which the disclosed subject matter is not limited.

Modern GPUs tend to be intensely parallel machines with numerous instances of internal sub-units (e.g., shader circuit 105, rasterizer circuit 106). Graphics processors typically run numerous parallel operations in essentially a limitless combination of usage patterns governed solely by the imagination of the application writers. Consequently, it is very difficult for designers to know beforehand exactly what design trade-offs should be made to optimally configure a machine.

In one embodiment, the disclosed subject matter, in its performance monitor capacity, may provide a highly efficient (in terms of area and power) mechanism for capturing a variety of event data that may be used by system designers to improve GPU (or more generally processor) system performance. In the disclosed subject matter's debug capacity, this same logic can provide numerous programmable mechanisms for capturing events and aiding in debugging of complex issues within the processor or system 100. It is understood that the above are merely a few illustrative examples to which the disclosed subject matter is not limited.

In the illustrated embodiment, the system 100 may include a plurality of performance and debug monitoring circuits (PDMCs) 126. Each of these PDMCs 126 may be configured to count or record events occurring within a local associated CLB 120, or may cascade these events into triggers that create more complex programmable events. The PDMCs 126 may each include a small hardware sub-unit that is judiciously instantiated in a variety of major units (e.g., rasterizer circuit 106) within the overall system 100, and provide complex triggering for both performance counters and debug information. In various embodiments, some circuit, FUBs, or CLBs 120 may include more than one PDCM 126.

In the illustrated embodiment, the PDMCs 126 may be configured to communicate with each other via a PDCM bus or network 186. This PDCM network 186 may allow events monitored in one PDCM 126 to act as a trigger in another PDCM 126. Further, a single PDCM 126 may feed its own events or count back upon itself to act as its own trigger. In various embodiments, the PDCM network 186 may include a cross-bar switch or interconnection matrix. It is understood that the above are merely a few illustrative examples to which the disclosed subject matter is not limited.

In various embodiments, each PDMC 126 may be programmed to increment in a fashion very similar to many logic analyzers. That is to say, incrementing may be based on a combination of input signals, a comparison of input signal values. It is understood that the above are merely a few illustrative examples to which the disclosed subject matter is not limited.

In various embodiments, usage cases may include, but are not limited to:

a) Incrementing the PDMC counter when an input signal is high. In such an embodiment, the PDMC 126 may be employed to count how many graphical primitives are written to a given FUB.

b) Incrementing a PDMC counter by a value specified on one of the multi-bit input signals when another multi-bit input signal equals a specific value and a single-bit input signals is enabled. In such an embodiment, the PDMC 126 may be employed to capture how many primitives were dropped due to a specific command issued to system 100 (e.g., as a result of culling or clipping).

c) Incrementing when a multi-bit input signal is greater than or equal to a configuration value and the same multi-bit input signal is less than or equal to another configuration value and a single-bit input signal is high. In such an embodiment, the PDMC 126 may be employed to count how many cycles between when a first instruction is "done" and a second instruction "done".

It is understood that the above are merely a few illustrative examples to which the disclosed subject matter is not limited.

Further, in various embodiments, the choice of what input signals are coupled with a particular instance of a PDCM 126 in a given CLB 120 may be defined by a combination of the system 100 designer's or debug engineers based on what events are deemed necessary and/or interesting. As described above, each PDCM 126 may be associated with one or more CLBs, and may be responsible (if programed to do so) to count or monitor the internal workings of that respective CLB.

Figure 2A:
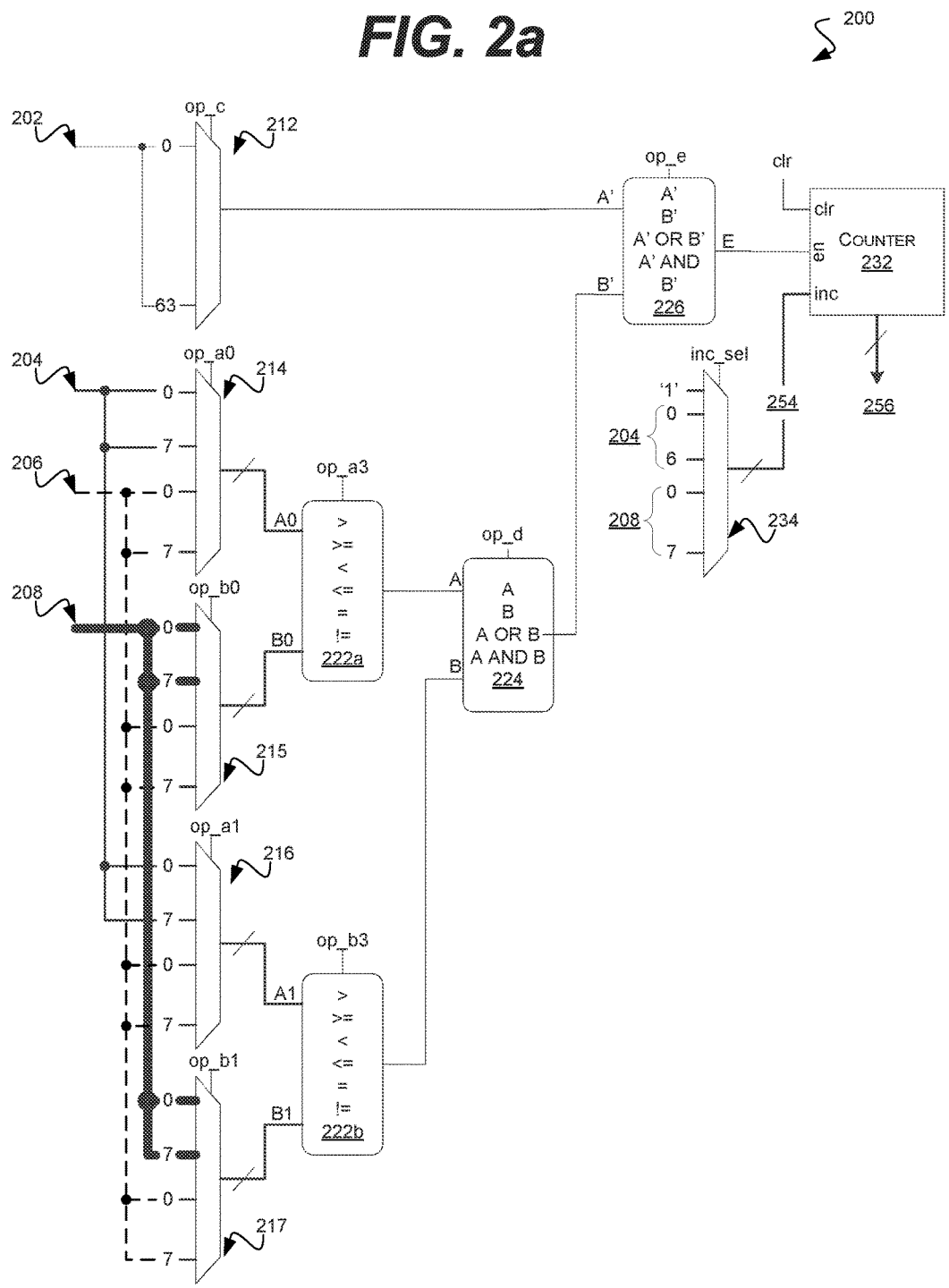
FIG. 2a is a block diagram of an example embodiment of a system in accordance with the disclosed subject matter.

FIG. 2a is a block diagram of an example embodiment of a performance and debug monitoring circuit (PDMC) 200 in accordance with the disclosed subject matter. In various embodiments, the PDMC 200 may provide a high degree of flexibility and configurability in terms of data capturing all while using a relatively small set of registers and logic. In such an embodiment, this may make it quite acceptable to instantiate numerous instances of the PDMC 200 within a system, as described above.

In the illustrated embodiment, the PDMC 200 includes 64 single-bit input signals 202 and up to 8 multi-bit input signals 204, 206, and 208. In the illustrated embodiment, the multi-bit input signals 204, 206, and 208 may be up to 32 bits wide. Likewise the multi-bit output signal 256 may include 32-bits. It is understood that the above is merely one illustrative example to which the disclosed subject matter is not limited.

In the illustrated embodiment, the PDMC 200 may receive a number (e.g., 64) single-bit input signals 202 from combinatorial logic circuits or blocks. These may include flags or values of internal (to the CLBs) inputs/outputs to/from Boolean logic circuits. Again, which single-bit input signals 202 are selected may be determined during the design phase of the chip.

In the illustrated embodiment, the PDMC 200 may receive a number (e.g., 8) multi-bit (e.g., 32 bits) input signals 204 from combinatorial logic circuits or blocks. These multi-bit signals 204 may include registers or buses used by the CLBs. For example, one multi-bit input signal 204 may represent the value of a register that holds the color of a pixel. Another multi-bit input signal 204 may represent an instruction assigned to a given CLB. It is understood that the above are merely a few illustrative examples to which the disclosed subject matter is not limited.

In the illustrated embodiment, the PDMC 200 may receive a number (e.g., 8) multi-bit (e.g., 32 bits) input signals 206 from other PDCMs 200. These multi-bit signals 206 may include the counter output signals 256 from this or other PDCMs 200. In such an embodiment, the PDCMs may be cascaded or may generally influence each other. In such an embodiment, the count of a first PDMC 200 may be a trigger for a second PDMC 200. In the illustrated embodiment, the counter output signal 256 from the illustrated PDMC 200 may be fed directly back to itself via one of the input signals 206. Thus, output 256 of the PDMC 200 may be used as (one of a possible plurality of inputs) its own trigger for future events.

In the illustrated embodiment, the PDMC 200 may receive a number (e.g., 8) multi-bit (e.g., 32 bits) input signals 208 from configuration registers (not shown). These multi-bit signals 208 may include values dynamically set as triggers for the PDMC 200. For example, if a debug engineer wishes to know how often a CLB register exceeds a threshold value, the debug engineer may store the threshold value in one of the configuration register input signals 208, and then program the PDCM 200 to compare the CLB register (an input signal 204) against that configuration register input signals 208. When the two values meet the comparison criteria (CLB register greater than the threshold) the PDCM counter 232 may increment. In various embodiments, each PDCM 200 may include 8 configuration registers (not shown) that hold values for these input signals 208.

Further, each PDCM 200 may include a number of configuration settings registers (not shown) to store configuration or programming settings. The number or width of these configuration setting registers may vary based upon the number/width of the input signals 202, 204, 206, 208, and the operations (e.g., AND, less than) supported by the PDCM 200 (via, for example, the comparator 222a and logic 224). In various embodiments, the configuration registers may be set via the interconnect bus shown in FIG. 1, a scan chain, a debug port, or another access technique.

In the illustrated embodiment, 38 configuration bits or registers may be included in the PDCM 200. These may include a 6-bit op_c[5:0]; 4 bit op_a0[3:0], op_a1[3:0], op_b0[3:0], and op_b1[3:0]; 3-bit op_a3[2:0], op_b3[2:0], op_d[2:0], and op_e[2:0]; and a 4-bit inc_sel[3:0] values. In addition the clr[0] signal may be registered or not, depending upon the implementation. It is understood that the above is merely one illustrative example to which the disclosed subject matter is not limited.

In the illustrated embodiment, the multi-bit input signals 204, 206, and 208 may be input to the PDCM 200. These many (e.g., 24) multi-bit input signals 204, 206, and 208 may be weaned down to 4 triggering signals A0, B0, A1, and B1. This may be done by the selection circuits or multiplexers (MUXs) 214, 215, 216, and 217. These MUXs 214, 215, 216, and 217 may select which input signals 204, 206, and 208 to pass as the triggering signals A0, B0, A1, and B1 based upon the configuration signals op_a0, op_b0, op_a1, and op_b0, respectively.

In the illustrated embodiment, each MUX 214, 215, 216, and 217 receives all 8 signals of two of the three input signal groups (e.g., CLB inputs 204, PDCM counter inputs 206, or configuration inputs 208). Therefore, each MUX 214, 215, 216, and 217 receives 16 multi-bit input signals, and selects one of those to go to the next stage of PDCM processing. As such the next stage of PDCM processing involves only 4 multi-bit input (or selected, at this point) signals A0, B0, A1, and B1.

Each input signal group 204, 206, and 208 is arranged such that they each feed into two of the MUXes 214, 215, 216, and 217. This is done such that, if desired, two different signals from the same input signal groups (e.g., CLB inputs 204, PDCM counter inputs 206, or configuration inputs 208) may be used. It is understood that the above are merely a few illustrative examples to which the disclosed subject matter is not limited.

Once the selection stage (for the multi-bit input signals 204, 206, and 208) is completed the triggering inputs have been selected, and those selected inputs A0, B0, A1, and B1, proceed to a combinatorial stage of PDCM processing. The single-bit processing case will be discussed later.

In the illustrated embodiment, the PDCM 200 may be configured to perform a number of possible comparative operations (e.g., greater than, greater than or equal to, less than, less than or equal to, equal to, or not equal to). Which comparative operation is performed may be dynamically selected by one of the configuration settings (e.g., op_a3, op_b3).

The comparative operations may be performed by the comparators 222a and 222b. These comparators 222a and 222b may perform different operations on their respective inputs. In the illustrated embodiment, the comparator 222a may receive as input the selected input signals A0 and B0, and the configuration setting op_a3. The comparator 222a may perform the selected (by op_a3) comparison operation (as described above) and produce the output single-bit signal A. Likewise, the comparator 222b may receive as input the selected input signals A1 and B1, and the configuration setting op_b3. The comparator 222b may perform the selected (by op_b3) comparison operation (as described above) and produce the output single-bit signal B. Thus may an input signal (e.g., a CLB register) be comparted against a threshold value (e.g., a configuration register), or the results of a first PDCM (one of the eighth input signals 206) be compared against another PDCM (a second one of the eighth input signals 206), or any of the input signals 204, 206, and 208 be compared against any other of the input signals 204, 206, and 208.

In such an embodiment, the single-bit signals A and B may represent possible triggering events that have occurred. These possible triggering events may then be further processed to determine if a desired (as determined by the configuration settings) triggering event has actually occurred. This is done by the further processing portions of the PDCM 200's combinatorial stage of processing.

In the illustrated embodiment, the Boolean logic circuit 224 may perform a Boolean logic operation (e.g., A, B, A OR B, A AND B, A XOR B, NOT A, NOT B) on the single-bit, possible triggering event signals A and B. The desired Boolean logic operation may be selected by the configuration setting signal op_d. The Boolean logic circuit 224 may output the intermediate trigger signal B'. The intermediate trigger signal B' may indicate that a possible triggering event has occurred in relation to one of the multi-bit input signals 204, 206, and/or 208.

Returning to the single-bit input signals 202, like the multi-bit input signals 204, 206, and 208, the single-bit input signals 202 may experience their own selection stage. In the illustrated embodiment, the selector circuit or MUX 212 may select which of the 64 single-bit input signals 202 to look at. The selection of the input signals 202 may be governed by the configuration settings signal op_c. The MUX 212 may then output a sole single-bit signal A'. This signal A' may represent an intermediate trigger signal that indicates that some triggering event may have occurred in relation to one of the single-bit input signals 202. Similarly to that described above, this signal A' may be passed to the PDCM 200's combinatorial stage of further processing.

In the illustrated embodiment, the Boolean logic circuit 226 may perform a Boolean logic operation (as described above) on the single-bit, intermediate triggering event signals A' and B'. The desired Boolean logic operation may be selected by the configuration setting signal op_e. The Boolean logic circuit 226 may output the trigger event signal E. The trigger event signal E indicates some triggering event has occurred in relation to one of the input signals 202, 204, 206, and/or 208.

In the illustrated embodiment, the PDCM 200 may include a counter 232. In various embodiments, the counter 232 may be cleared or reset to a known value (e.g., zero) by the clr signal. In some embodiments, the clr signal may be employed to turn off the PDCM 200 when not in use (e.g., when not operating in a debug mode, or when monitoring performance is no longer desirable). In another embodiment, traditional clock gating may be employed. It is understood that the above are merely a few illustrative examples to which the disclosed subject matter is not limited.

In the illustrated embodiment, the counter 232 may increment when a triggering event has occurred. This may be determined via the triggering event signal E that is output from the Boolean logic circuit 226. In some embodiments, the counter 232 may simply increment by a value of 1.

In another embodiment, the counter 232 may increment by a dynamically chosen value. In such an embodiment, the value to increment by may be selected from one of the input signals 202, 204, 206, or 208. The selector circuit or MUX 234 may perform this selection based upon the configuration setting signal inc_sel. The MUX 234 may output the counter interment value 254.

In the illustrated embodiment, the multi-bit inputs signals 204 and 208 (the CLB multi-bit input signals and the configuration multi-bit input signals, respectively) may be used. It is noted that, in the illustrated embodiment, only a sub-set (e.g., 7 out of the 8 groups) of the CLB input signals 204 are employed. This is done to make a space for a constant increment option of 1. It is understood that the above is merely one illustrative example to which the disclosed subject matter is not limited.

The counter 232, when instructed by the triggering event signal E, may then increment by the counter interment value 254. The counter 232 may generate or output the counter value 256. As described above, this counter value 256 may be sent to other PDCMs or feedback to the same PDCM 200. In either case it may make up part of the PDCM input signals 206. In various embodiments, the counter value 256 may also be output to a register or other memory for inspection by a human (e.g., a debug engineer, a performance engineer) or further logic analysis tool. It is understood that the above are merely a few illustrative examples to which the disclosed subject matter is not limited.

In various embodiments, example ways in which the PDCM 200 may be employed include, but are not limited to:

a) Counting how many cycles an output interface was back-pressured. In such an embodiment, a single-bit input signal 202 would be tied to the CLB condition Requested but not Ready (req & !rdy). The MUX 212 and Boolean Logic circuit 226 would select that input signal 202 to be the triggering event signal E (the multi-bit input signals 204, 206, and 208 would be ignored in this case). The counter 232 would increment by 1 whenever that triggering event occurs.

b) Counting how many cache misses happened in a given cache controller between cycles 3000 and 4000. In such an embodiment, a single-bit input signal 202 would be tied to or indicate that a cache miss occurs. A first configuration register (and hence a $1^{st}$ group of the input signals 208) would be programed to a value of 3000. A second configuration register (and hence a $2^{nd}$ group of the input signals 208) would be programed to a value of 4000. The comparator 222a would be programed to be TRUE when the cycle count (e.g., an input signal 204) is greater than the $1^{st}$ group of the input signals 208 (i.e., 3000), and the comparator 222b would be programed to be TRUE when the cycle count (e.g., an input signal 204) is less than the $2^{nd}$ group of the input signals 208 (i.e., 4000). The Boolean logic circuit 224 would be programmed to AND those single-bit signals A and B. The Boolean logic circuit 226 would be programmed to just pass the intermediate signal B'. The counter 232 would increment by 1 whenever that triggering event E occurs.

c) Knowing how many graphical primitives in a FUB (e.g., a Culling Unit) are dropped or culled from a specific draw call (e.g., DrawID 345). In such an embodiment, a single-bit input signal 202 would be tied to the CLB drop (or cull) signal. In various embodiments, a single cycle pulse may occur on this signal when a primitive is dropped. A first group of CLB multi-bit input signals 204 may be set to the identifier found in the DrawID register of the CLB. A first configuration register (and hence a first group of configuration input signals 208) may be set to the value of the desired DrawID number (e.g., 345). The MUX 212 would select that drop input signal 202 to be the intermediate triggering signal A'. The comparator 222a would be programed to be TRUE when the DrawID register (e.g., an input signal 204) equals the $1^{st}$ group of the configuration input signals 208 (i.e., 345). The Boolean logic circuit 224 would be programmed to just pass signal A as the intermediate signal B'. The Boolean logic circuit 226 would be programmed to AND the intermediate signals A' and B'. A second group of CLB multi-bit input signals 204 may be set to be the number of graphical primitives dropped. The counter 232 would be programmed to be incremented (when signal E is TRUE) by the value of the second group of input signals 204 (the number of primitives dropped).

It is understood that the above are merely a few illustrative examples to which the disclosed subject matter is not limited.

While the PCDM 200 has been discussed as having a certain number of inputs, certain widths to the various signals, levels of logic in the various stages, types of combinatorial logic, and types of inputs, it is understood that the above are merely a few illustrative examples to which the disclosed subject matter is not limited. Depending on the particular circumstances of the CLB to which the PDCM 200 is connected or associated, the embodiment of the PDCM 200 may be enlarged or reduced. In some embodiments, this may be done by changing the synthesis-time parameters. In such an embodiment, any unneeded aspects of the PDCM 200 for a given instance may be removed during the synthesis process. In various embodiments, the characteristics (e.g., the width of the multi-bit input signals, the number of bits in a counter, the number of comparators) may be parameterized such that an automatic design tool may easily implement different embodiments of the PDCM 200.

Figure 2B:
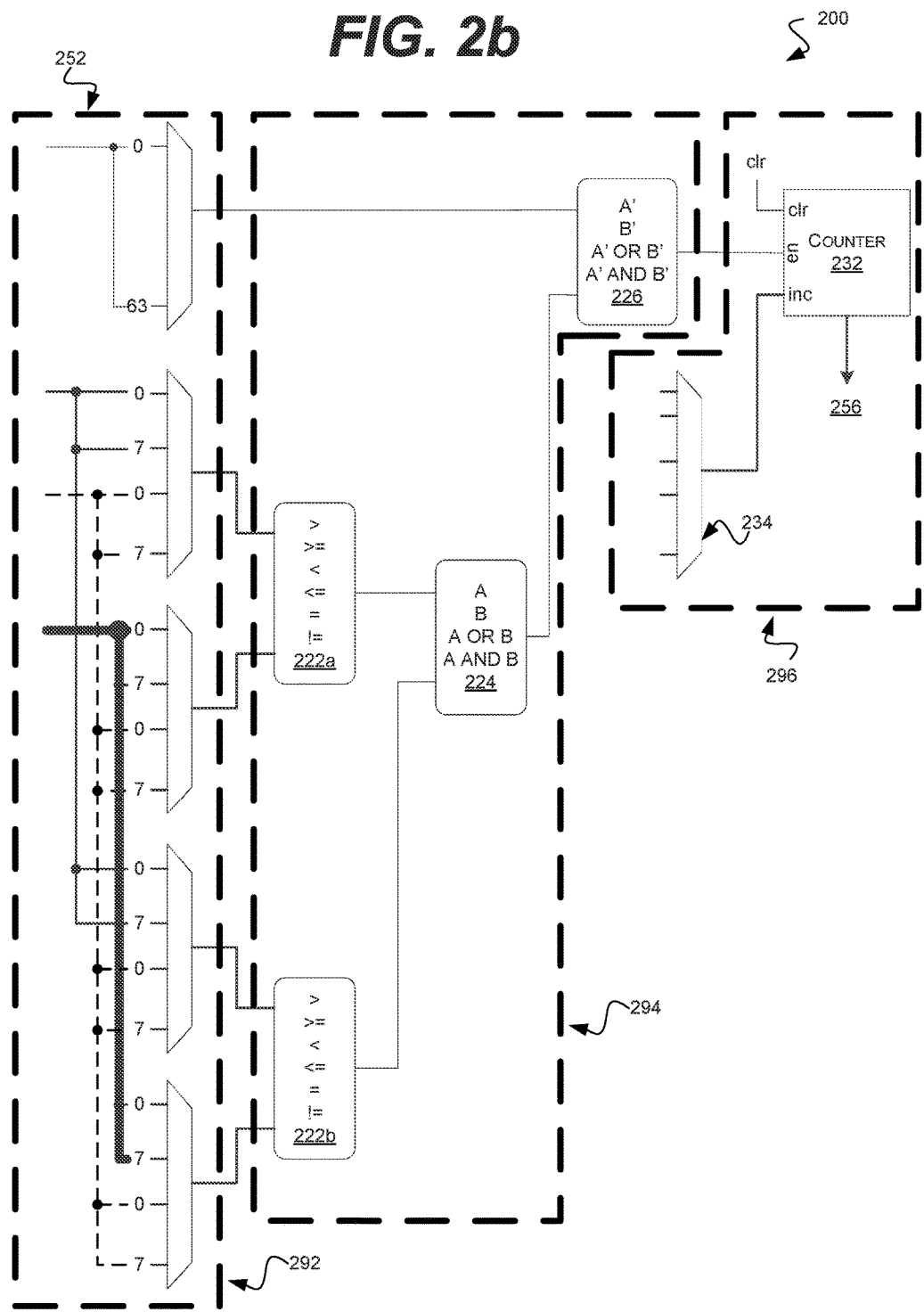
FIG. 2b is a block diagram of an example embodiment of a system in accordance with the disclosed subject matter.

FIG. 2b is a block diagram of an example embodiment of the PDCM 200 in accordance with the disclosed subject matter. FIG. 2b highlights and illustrates three stages or portions of the design of the PDCM 200. As such, the drawing has been slightly simplified. FIG. 2a may be examined to find any reference numbers referred to below, but not shown on FIG. 2b.

In one embodiment, the PDCM 200 may include an input or selection stage 292. The input or selection stage 292 may be configured to receive a plurality of input signals 202, 204, 206, and 208. Further, the input or selection stage 292 may be configured to select a sub-set of those input signals 202, 204, 206, and 208 to pass to the next stage of PDCM processing.

In the illustrated embodiment, the PDCM 200 may include a combinatorial stage 296. The combinatorial stage 294 may be configured to perform one or more logical operations on the selected sub-set of the input signals. In one embodiment, the combinatorial stage 294 may include a comparative stage (that includes comparators 222a and 222b) and a Boolean stage (that includes the Boolean logic circuits 224 and 226). In another embodiment, the combinatorial stage 294 may be thought of as including a multi-bit stage (that includes the comparators 222a & 222b and the Boolean logic circuit 224) and a single-bit or final stage (that includes the Boolean logic circuit 226). It is understood that the above are merely a few illustrative examples to which the disclosed subject matter is not limited.

In various embodiments, the PDCM 200 may include a counter 232, or a counter stage 296. In such an embodiment, the counter stage 296 may be configured to increment based, at least in part, upon a result of the combinatorial stage. In such an embodiment, the counter stage 296 may also include the MUX 234, and the counter 232 may also increment based, also in part upon, the value output by the MUX 234.

In some embodiments, the PDCM 200 may include a plurality of counters 232. In such an embodiment, each counter 23 may be associated with respective MUXs 234. In another embodiment, each PDCM 200 may include a plurality of combinatorial stages 294 that each trigger or enable an associated counter 232. It is understood that the above are merely a few illustrative examples to which the disclosed subject matter is not limited.

FIG. 3 is a schematic block diagram of an information processing system 300, which may include semiconductor devices formed according to principles of the disclosed subject matter.

Referring to FIG. 3, an information processing system 300 may include one or more of devices constructed according to the principles of the disclosed subject matter. In another embodiment, the information processing system 300 may employ or execute one or more techniques according to the principles of the disclosed subject matter.

In various embodiments, the information processing system 300 may include a computing device, such as, for example, a laptop, desktop, workstation, server, blade server, personal digital assistant, smartphone, tablet, and other appropriate computers or a virtual machine or virtual computing device thereof. In various embodiments, the information processing system 300 may be used by a user (not shown).

The information processing system 300 according to the disclosed subject matter may further include a central processing unit (CPU), logic, or processor 310. In some embodiments, the processor 310 may include one or more functional unit blocks (FUBs) or combinational logic blocks (CLBs) 315. In such an embodiment, a combinational logic block may include various Boolean logic operations (e.g., NAND, NOR, NOT, XOR), stabilizing logic devices (e.g., flip-flops, latches), other logic devices, or a combination thereof. These combinational logic operations may be configured in simple or complex fashion to process input signals to achieve a desired result. It is understood that while a few illustrative examples of synchronous combinational logic operations are described, the disclosed subject matter is not so limited and may include asynchronous operations, or a mixture thereof. In one embodiment, the combinational logic operations may comprise a plurality of complementary metal oxide semiconductors (CMOS) transistors. In various embodiments, these CMOS transistors may be arranged into gates that perform the logical operations; although it is understood that other technologies may be used and are within the scope of the disclosed subject matter.

The information processing system 300 according to the disclosed subject matter may further include a volatile memory 320 (e.g., a Random Access Memory (RAM)). The information processing system 300 according to the disclosed subject matter may further include a non-volatile memory 330 (e.g., a hard drive, an optical memory, a NAND or Flash memory). In some embodiments, either the volatile memory 320, the non-volatile memory 330, or a combination or portions thereof may be referred to as a "storage medium". In various embodiments, the volatile memory 320 and/or the non-volatile memory 330 may be configured to store data in a semi-permanent or substantially permanent form.

In various embodiments, the information processing system 300 may include one or more network interfaces 340 configured to allow the information processing system 300 to be part of and communicate via a communications network. Examples of a Wi-Fi protocol may include, but are not limited to, Institute of Electrical and Electronics Engineers (IEEE) 802.11g, IEEE 802.11n. Examples of a cellular protocol may include, but are not limited to: IEEE 802.16m (a.k.a. Wireless-MAN (Metropolitan Area Network) Advanced, Long Term Evolution (LTE) Advanced, Enhanced Data rates for GSM (Global System for Mobile Communications) Evolution (EDGE), Evolved High-Speed Packet Access (HSPA+). Examples of a wired protocol may include, but are not limited to, IEEE 802.3 (a.k.a. Ethernet), Fibre Channel, Power Line communication (e.g., HomePlug, IEEE 1901). It is understood that the above are merely a few illustrative examples to which the disclosed subject matter is not limited.

The information processing system 300 according to the disclosed subject matter may further include a user interface unit 350 (e.g., a display adapter, a haptic interface, a human interface device). In various embodiments, this user interface unit 350 may be configured to either receive input from a user and/or provide output to a user. Other kinds of devices may be used to provide for interaction with a user as well; for example, feedback provided to the user may be any form of sensory feedback, e.g., visual feedback, auditory feedback, or tactile feedback; and input from the user may be received in any form, including acoustic, speech, or tactile input.

In various embodiments, the information processing system 300 may include one or more other devices or hardware components 360 (e.g., a display or monitor, a keyboard, a mouse, a camera, a fingerprint reader, a video processor). It is understood that the above are merely a few illustrative examples to which the disclosed subject matter is not limited.

The information processing system 300 according to the disclosed subject matter may further include one or more system buses 305. In such an embodiment, the system bus 305 may be configured to communicatively couple the processor 310, the volatile memory 320, the non-volatile memory 330, the network interface 340, the user interface unit 350, and one or more hardware components 360. Data processed by the processor 310 or data inputted from outside of the non-volatile memory 330 may be stored in either the non-volatile memory 330 or the volatile memory 320.

In various embodiments, the information processing system 300 may include or execute one or more software components 370. In some embodiments, the software components 370 may include an operating system (OS) and/or an application. In some embodiments, the OS may be configured to provide one or more services to an application and manage or act as an intermediary between the application and the various hardware components (e.g., the processor 310, a network interface 340) of the information processing system 300. In such an embodiment, the information processing system 300 may include one or more native applications, which may be installed locally (e.g., within the non-volatile memory 330) and configured to be executed directly by the processor 310 and directly interact with the OS. In such an embodiment, the native applications may include pre-compiled machine executable code. In some embodiments, the native applications may include a script interpreter (e.g., C shell (csh), AppleScript, AutoHotkey) or a virtual execution machine (VM) (e.g., the Java Virtual Machine, the Microsoft Common Language Runtime) that are configured to translate source or object code into executable code which is then executed by the processor 310.

The semiconductor devices described above may be encapsulated using various packaging techniques. For example, semiconductor devices constructed according to principles of the disclosed subject matter may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique, a wafer-level processed stack package (WSP) technique, or other technique as will be known to those skilled in the art.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

In various embodiments, a computer readable medium may include instructions that, when executed, cause a device to perform at least a portion of the method steps. In some embodiments, the computer readable medium may be included in a magnetic medium, optical medium, other medium, or a combination thereof (e.g., CD-ROM, hard drive, a read-only memory, a flash drive). In such an embodiment, the computer readable medium may be a tangibly and non-transitorily embodied article of manufacture.

While the principles of the disclosed subject matter have been described with reference to example embodiments, it will be apparent to those skilled in the art that various changes and modifications may be made thereto without departing from the spirit and scope of these disclosed concepts. Therefore, it should be understood that the above embodiments are not limiting, but are illustrative only. Thus, the scope of the disclosed concepts are to be determined by the broadest permissible interpretation of the following claims and their equivalents, and should not be restricted or limited by the foregoing description. It is, therefore, to be understood that the appended claims are intended to cover all such modifications and changes as fall within the scope of the embodiments.

What is claimed is:

1. An apparatus comprising:
   a plurality of performance and debug monitoring circuits (PDMCs); and
   wherein each performance and debug monitoring circuit (PDMC) comprises:
   an input stage configured to receive a plurality of input signals, wherein the input signals include: signals from other performance and debug monitoring circuits, signals from combinatorial logic circuits, and configuration values;
   a combinatorial stage configured to perform one or more comparison and logical operations on a selected sub-set of the input signals; and
   a counter configured to increment based, at least in part, upon a result of the combinatorial stage.

2. The apparatus of claim 1, wherein the signals from other PDMCs each include a counter value associated with the respective other PDMCs; and
   wherein the input signals for a current PDMC includes counter value that is feedback from the counter of the current PDMC to the input stage of the current PDMC.

3. The apparatus of claim 1, wherein the combinatorial stage comprises a plurality of different logical operations, and wherein one or more logical operations is performed is dynamically selected based upon a configuration setting.

4. The apparatus of claim 1, wherein the counter is configured to increment by an increment value associated with a selected one of the input signals, and wherein the selected one of the input signals is dynamically selected based upon a configuration setting.

5. The apparatus of claim 1, wherein the input signals include a first portion comprising multi-bit input signals, and a second portion comprising single-bit input signals; and
   wherein the input stage comprises a plurality of selection circuits configured to select a sub-set of input signals to pass to the combinatorial stage.

6. The apparatus of claim 5, wherein the combinatorial stage comprises a first portion and a second portion;
   wherein the first portion of the combinatorial stage comprises:
   a first stage of the combinatorial stage configured to perform, at least, a comparative operation on the sub-set of input signals, and
   a second stage of the combinatorial stage configured to perform, at least, a Boolean operation on the outputs of the first stage; and
   wherein the second portion of the combinatorial stage is configured to perform, at least, a Boolean operation on the outputs of the first portion of the combinatorial stage and a sub-set of the second portion of the input signals.

7. The apparatus of claim 6, wherein the comparative and Boolean operations of the first stage of the combinatorial stage, and the Boolean operation of the second stage of the combinatorial stage are dynamically selectable from a set of predetermined operations based upon respective configuration settings.

8. The apparatus of claim 1, wherein the combinatorial stage comprises:
   a plurality of comparative stages, wherein each comparative stage is configured to perform, at least, a comparative operation on at least a portion of the input signals or at least one output of another portion of the combinatorial stage;
   a plurality of Boolean stages, wherein each Boolean stage is configured to perform, at least, a Boolean operation on at least a portion of the input signals o or at least one output of another portion of the combinatorial stage;
   wherein the a plurality of comparative stages and a plurality of Boolean stages are arranged to perform one or more logical operations on the selected sub-set of the input signals.

9. A system comprising:
   a graphic processing circuit configured to manipulate and alter data in a memory to create images for output to a display device, comprising a plurality of combinatorial logic circuits;

a plurality of performance and debug monitoring circuits (PDMCs); and wherein each performance and debug monitoring circuit (PDMC) comprises:

an input stage configured to receive a plurality of input signals, wherein the input signals include: signals from other performance and debug monitoring circuits, signals from combinatorial logic circuits, and configuration values;

a combinatorial stage configured to perform one or more comparison and logical operations on a selected sub-set of the input signals; and a counter configured to increment based, at least in part, upon a result of the combinatorial stage.

10. The system of claim 9, wherein the signals from other PDMCs each include a counter value associated with the respective other PDMCs; and wherein the input signals for a current PDMC includes a counter value that is feedback from the counter of the current PDMC to the input stage of the current PDMC.

11. The system of claim 9, wherein the combinatorial stage comprises a plurality of different logical operations, and which one or more logical operations is performed is dynamically selected based upon a configuration setting.

12. The system of claim 9, wherein the counter is configured to increment by an increment value associated with a selected one of the input signals, and wherein the selected one of the input signals is dynamically selected based upon a configuration setting.

13. The system of claim 9, wherein the input signals include a first portion comprising multi-bit input signals, and a second portion comprising single-bit input signals; and wherein the input stage comprises a plurality of selection circuits configured to select a sub-set of input signals to pass to the combinatorial stage.

14. The system of claim 13, wherein the combinatorial stage comprises a first portion and a second portion;

wherein the first portion of the combinatorial stage comprises:

a first stage of the combinatorial stage configured to perform, at least, a comparative operation on the sub-set of input signals, and a second stage of the combinatorial stage configured to perform, at least, a Boolean operation on the outputs of the first stage; and wherein the second portion of the combinatorial stage is configured to perform, at least, a Boolean operation on the outputs of the first portion of the combinatorial stage and a sub-set of the second portion of the input signals.

15. The system of claim 14, wherein the comparative and Boolean operations of the first stage of the combinatorial stage, and the Boolean operation of the second stage of the combinatorial stage are dynamically selectable from a set of predetermined operations based upon respective configuration settings.

16. The system of claim 9, wherein each PDMC is associated with and receives signals from a respective combinatorial logic circuit.

17. A method comprising:

receiving, by a performance and debug monitoring circuit (PDMC), a plurality of input signals, wherein the input signals include: signals from other PDMCs, signals from combinatorial logic circuits, and configuration values;

performing one or more comparison and logical operations on a selected sub-set of the input signals; and incrementing a counter based, at least in part, upon a result of the one or more logical operations.

18. The method of claim 17, wherein the signals from other PDMCs each include a counter value associated with the respective other PDMCs; and wherein the input signals for the PDMC further includes a counter value that is feedback from the counter of the PDMC to the input stage of the PDMC.

19. The method of claim 17, wherein incrementing a counter comprises incrementing the counter by an increment value associated with a selected one of the input signals, and wherein the selected one of the input signals is dynamically selected based upon a configuration setting.

20. The method of claim 17, wherein receiving the plurality of input signals comprises selecting a sub-set of a multi-bit portion the input signals, and selecting a sub-set of a single-bit portion the input signals;

wherein performing one or more logical operations comprises:

performing a comparative operation on the sub-set of the multi-bit portion of the input signals;

performing a Boolean operation on an output of the comparative operation; and generating an enable to the counter, by performing a Boolean operation on the sub-set of the single-bit portion of the input signals, and a result of the Boolean operation of the output of the comparative operation.

* * * * *